United States Patent
Tanji et al.

(10) Patent No.: US 11,585,879 B2
(45) Date of Patent: Feb. 21, 2023

(54) RADIO FREQUENCY AMPLIFYING DEVICE AND MAGNETIC RESONANCE IMAGING APPARATUS

(71) Applicant: CANON MEDICAL SYSTEMS CORPORATION, Otawara (JP)

(72) Inventors: Masaki Tanji, Nasushiobara (JP); Susumu Kawaguchi, Hachioji (JP); Hajime Tanaka, Sakura (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 365 days.

(21) Appl. No.: 17/002,888

(22) Filed: Aug. 26, 2020

(65) Prior Publication Data

US 2021/0063513 A1  Mar. 4, 2021

(30) Foreign Application Priority Data

Sep. 4, 2019  (JP) .............................. JP2019-161380

(51) Int. Cl.
*G01R 33/36* (2006.01)
*H03F 3/19* (2006.01)
*H03G 3/30* (2006.01)

(52) U.S. Cl.
CPC .......... *G01R 33/3614* (2013.01); *H03F 3/19* (2013.01); *H03G 3/3036* (2013.01); *H03F 2200/451* (2013.01); *H03G 2201/103* (2013.01); *H03G 2201/307* (2013.01)

(58) Field of Classification Search
CPC . G01R 33/3614; H03F 3/19; H03F 2200/451; H03F 2200/207; H03F 2200/462; H03F 2200/471; H03F 1/0233; H03F 1/3247; H03F 1/56; H03G 3/3036; H03G 2201/103; H03G 2201/307; H03G 3/3042
See application file for complete search history.

(56) References Cited

U.S. PATENT DOCUMENTS

| | | | |
|---|---|---|---|
| 2006/0267688 A1 | 11/2006 | Tanoue et al. | |
| 2012/0208476 A1 | 8/2012 | Tanoue et al. | |
| 2018/0248534 A1* | 8/2018 | Yuzurihara | H03H 11/40 |
| 2019/0250225 A1* | 8/2019 | Tanji | G01R 33/36 |

FOREIGN PATENT DOCUMENTS

| | | | |
|---|---|---|---|
| JP | 2006-319508 A | | 11/2006 |
| JP | 2016086371 A | * | 5/2016 |

OTHER PUBLICATIONS

Machine translation of JP-2016086371-A1 (Year: 2016).*

* cited by examiner

*Primary Examiner* — G. M. A Hyder
(74) *Attorney, Agent, or Firm* — Oblon, McClelland, Maier & Neustadt, L.L.P.

(57) ABSTRACT

A radio frequency amplifying device according to an embodiment includes load impedance calculating circuitry and controlling circuitry. The load impedance calculating circuitry is configured to calculate a load impedance on the basis of information about a voltage standing wave rate and a phase on an output side of radio frequency amplifying circuitry. The controlling circuitry is configured to adjust a gain and a phase of a signal to be input to the radio frequency amplifying circuitry, in accordance with the load impedance calculated by the load impedance calculating circuitry.

10 Claims, 5 Drawing Sheets

RADIO FREQUENCY AMPLIFYING DEVICE AND MAGNETIC RESONANCE IMAGING APPARATUS

CROSS-REFERENCE TO RELATED APPLICATIONS

This application is based upon and claims the benefit of priority from Japanese Patent Application No. 2019-161380, filed on Sep. 4, 2019; the entire contents of which are incorporated herein by reference.

FIELD

Embodiments described herein relate generally to a radio frequency amplifying device and a magnetic resonance imaging apparatus.

BACKGROUND

Conventionally, Magnetic Resonance Imaging (MRI) apparatuses employ a radio frequency amplifying device configured to amplify a radio frequency. In the radio frequency amplifying device, for example, unmatched impedances may be caused as a result of a load impedance fluctuating from a specified value, for example, and linearity may therefore decrease in some situations.

DETAILED DESCRIPTION

Exemplary embodiments of a radio frequency amplifying device and a magnetic resonance imaging apparatus will be explained in detail below, with reference to the accompanying drawings.

A radio frequency amplifying device according to an embodiment includes load impedance calculating circuitry and controlling circuitry. The load impedance calculating circuitry is configured to calculate a load impedance on the basis of information about a voltage standing wave rate and a phase on an output side of radio frequency amplifying circuitry. The controlling circuitry is configured to adjust a gain and a phase of a signal to be input to the radio frequency amplifying circuitry, in accordance with the load impedance calculated by the load impedance calculating circuitry.

Figure 1:
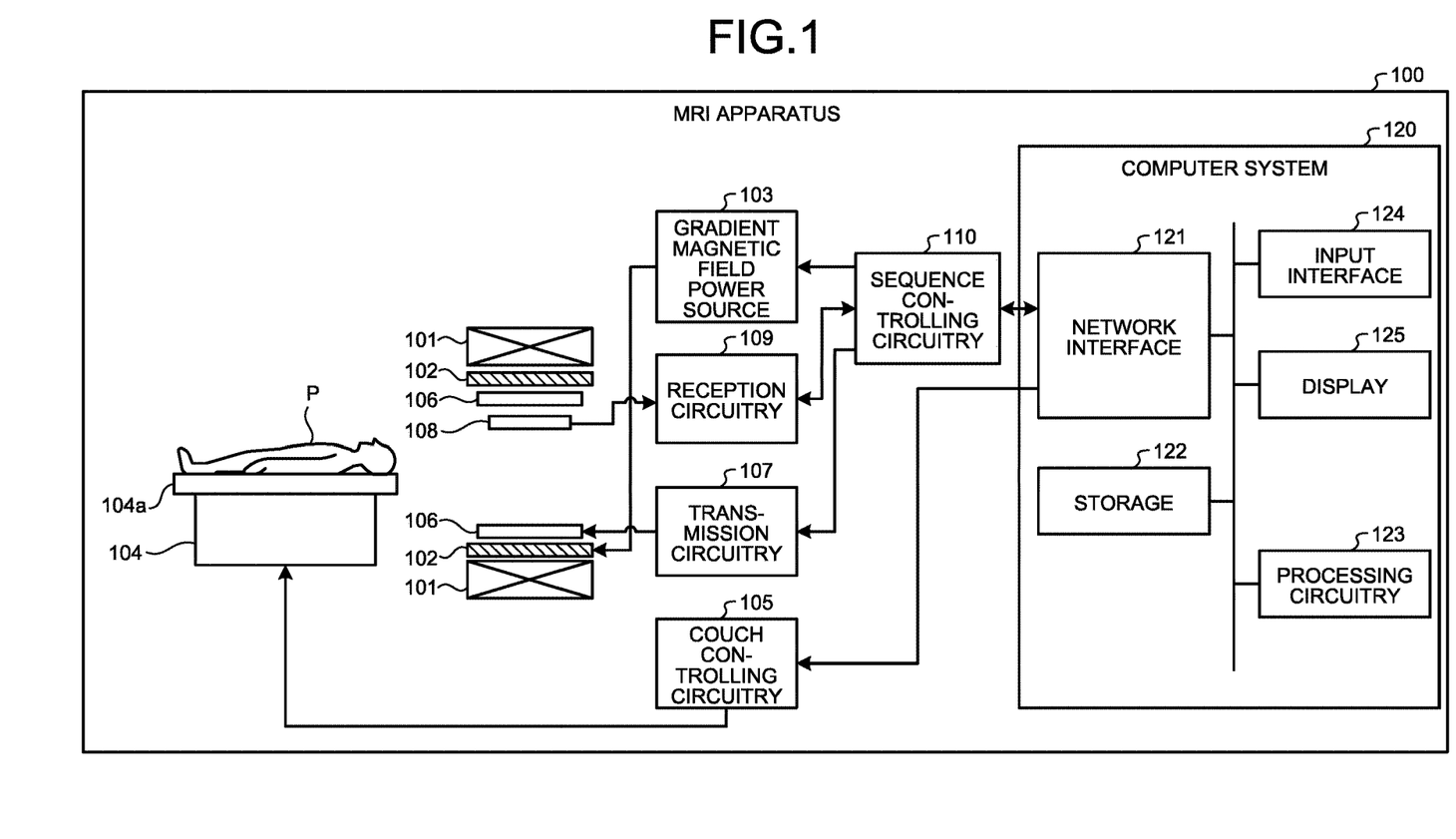
FIG. 1 is a block diagram illustrating an exemplary configuration of a magnetic resonance imaging apparatus according to an embodiment.

FIG. 1 is a block diagram illustrating an exemplary configuration of a Magnetic Resonance Imaging (MRI) apparatus 100 according to the present embodiment. The MRI apparatus 100 includes a static magnetic field magnet 101, a gradient coil 102, a gradient magnetic field power source 103, a couch 104, couch controlling circuitry 105, a transmission coil 106, transmission circuitry 107, a reception coil 108, reception circuitry 109, sequence controlling circuitry 110, and a computer system 120. The MRI apparatus 100 does not include an examined subject (hereinafter "patient") P (e.g., a human body).

The static magnetic field magnet 101 is a magnet formed to have a hollow and circular cylindrical shape (which may have an oval cross-section orthogonal to the axis thereof) and is configured to generate a uniform static magnetic field in the space inside thereof.

The gradient coil 102 is a coil formed to have a hollow and circular cylindrical shape (which may have an oval cross-section orthogonal to the axis thereof) and is configured to generate a gradient magnetic field. The gradient coil 102 is formed by combining together three coils corresponding to X-, Y-, and Z-axes that are orthogonal to one another. The three coils are configured to individually receive supply of an electric current from the gradient magnetic field power source 103 and to generate the gradient magnetic field of which the magnetic field intensities vary along the X-, Y-, and Z-axes.

The gradient magnetic field power source 103 is configured to supply the electric current to the gradient coil 102. For example, the gradient magnetic field power source 103 is configured to individually supply an electric current to each of the three coils structuring the gradient coil 102.

The couch 104 includes a couchtop 104a on which the patient P is placed. Under control of the couch controlling circuitry 105, the couchtop 104a is inserted to the inside of the hollow space (an image taking opening) of the gradient coil 102 while the patient P is placed thereon. The couch controlling circuitry 105 is a processor configured, under control of the computer system 120, to drive the couch 104 so as to move the couchtop 104a in longitudinal directions and up-and-down directions.

The transmission coil 106 is arranged on the inside of the gradient coil 102 and is configured to generate a radio frequency magnetic field by receiving supply of a Radio Frequency (RF) signal from the transmission circuitry 107. The transmission coil 106 is an example of the RF coil.

The transmission circuitry 107 is configured to generate an amplified signal by amplifying the RF signal input thereto from the sequence controlling circuitry 110. The transmission circuitry 107 is configured to output the generated amplified signal to the transmission coil 106. The transmission circuitry 107 is an example of the radio frequency amplifying device according to the present embodiment. A detailed configuration of the transmission circuitry 107 will be explained later. Further, in the present embodiment, the RF signal input to the transmission circuitry 107 from the sequence controlling circuitry 110 will be referred to as an RF input signal.

The reception coil 108 is arranged on the inside of the gradient coil 102 and is configured to receive a Magnetic Resonance signal (hereinafter, "MR signal") emitted from the patient P due to an influence of the radio frequency magnetic field. When having received the MR signal, the reception coil 108 is configured to output the received MR signal to the reception circuitry 109. Although FIG. 1 illustrates the configuration in which the reception coil 108 is provided separately from the transmission coil 106, this configuration is merely an example, and possible embodiments are not limited to this configuration. For instance, another configuration is also acceptable in which the reception coil 108 also serves as the transmission coil 106.

The reception circuitry 109 is configured to generate MR data by performing an analog/digital conversion on the analog MR signal output from the reception coil 108. Further, the reception circuitry 109 is configured to transmit the generated MR data to the sequence controlling circuitry 110. Alternatively, the analog/digital conversion may be performed inside the reception coil 108. Further, the reception circuitry 109 is also capable of performing arbitrary signal processing processes besides the analog/digital conversion.

The sequence controlling circuitry 110 is configured to perform an image taking process on the patient P, by controlling the gradient magnetic field power source 103, the transmission circuitry 107, and the reception circuitry 109, on the basis of sequence information transmitted thereto from the computer system 120. For example, the sequence controlling circuitry 110 is configured to define an amplification factor and the phase of the RF input signal for the transmission circuitry 107. Further, the sequence controlling circuitry 110 is configured to receive the MR data from the reception circuitry 109. The sequence controlling circuitry 110 is configured to transfer the received MR data to the computer system 120.

For example, the sequence controlling circuitry 110 may be realized by using one or more processors or may be realized by using a combination of software and hardware. The sequence controlling circuitry 110 is configured to input the RF input signal to the transmission circuitry 107 on the basis of the sequence information. The sequence controlling circuitry 110 may be referred to as a sequence controlling unit.

In this situation, the sequence information is information defining a procedure of the image taking process and includes information about controlling the transmission circuitry 107. Further, the sequence information includes, among others, the intensity of the power source to be supplied to the gradient coil 102 by the gradient magnetic field power source 103, as well as the timing with which the MR signal is detected by the reception circuitry 109.

The sequence controlling circuitry 110 is configured to transfer the received MR data to the computer system 120, when having received the MR data from the reception circuitry 109, as a result of performing the image taking process on the patient P by driving the gradient magnetic field power source 103, the transmission circuitry 107, and the reception circuitry 109.

The computer system 120 is configured to control the entire MRI apparatus 100, to acquire data, to reconstruct images, and the like. The computer system 120 includes a network interface 121, storage 122, processing circuitry 123, an input interface 124, and a display 125.

The network interface 121 is configured to transmit the sequence information to the sequence controlling circuitry 110 and to receive the MR data from the sequence controlling circuitry 110. Further, the MR data received by the network interface 121 is stored in the storage 122.

The storage 122 is has stored therein various types of programs. For example, the storage 122 is realized by using a semiconductor memory element such as a Random Access Memory (RAM) or a flash memory, or a hard disk, an optical disk, or the like. Also, the storage 122 may be used as a non-transitory storage medium configured with hardware. The storage 122 is one example of storage or a memory.

The input interface 124 is configured to receive various types of instructions and inputs of information from an operator such as a medical doctor or a radiological technologist. For example, the input interface 124 is realized by using a trackball, a switch button, a mouse, a keyboard, and/or the like. The input interface 124 is connected to the processing circuitry 123 and is configured to convert input operations received from the operator into electrical signals and to output the electrical signals to the processing circuitry 123. In the present embodiment, the input interface 124 does not necessarily have to include physical operation component parts such as a mouse, a keyboard, and/or the like. Possible examples of the input interface 124 include electrical signal processing circuitry configured to receive an electrical signal corresponding to an input operation from an external input device provided separately from the MRI apparatus 100 and to output the received electrical signal to the processing circuitry 123.

Under control of the processing circuitry 123, the display 125 is configured to display various types of Graphical User Interfaces (GUIs), Magnetic Resonance (MR) images, and the like.

The processing circuitry 123 is configured to control the entire MRI apparatus 100. More specifically, the processing circuitry 123 is configured to control the image taking process by generating the sequence information on the basis of image taking conditions input by the operator via the input interface 124 and transmitting the generated sequence information to the sequence controlling circuitry 110.

Further, the processing circuitry 123 is configured to arrange the MR data sent thereto from the sequence controlling circuitry 110 as a result of the image taking process, in accordance with a phase encoding amount and a frequency encoding amount given by the abovementioned gradient magnetic field. The arranged MR data is called k-space data. An MR image is generated by performing a reconstructing process such as a Fourier transform, for example, on the k-space data. The processing circuitry 123 is configured to exercise control so as to cause the display 125 to display the generated MR image. The processing circuitry 123 is realized by using a processor.

By executing various types of programs read from the storage 122, the processing circuitry 123 is configured to realize functions corresponding to the programs. Alternatively, the processing circuitry 123 may be structured by combining together a plurality of independent processors.

Next, details of the transmission circuitry 107 according to the present embodiment will be explained.

Figure 2:
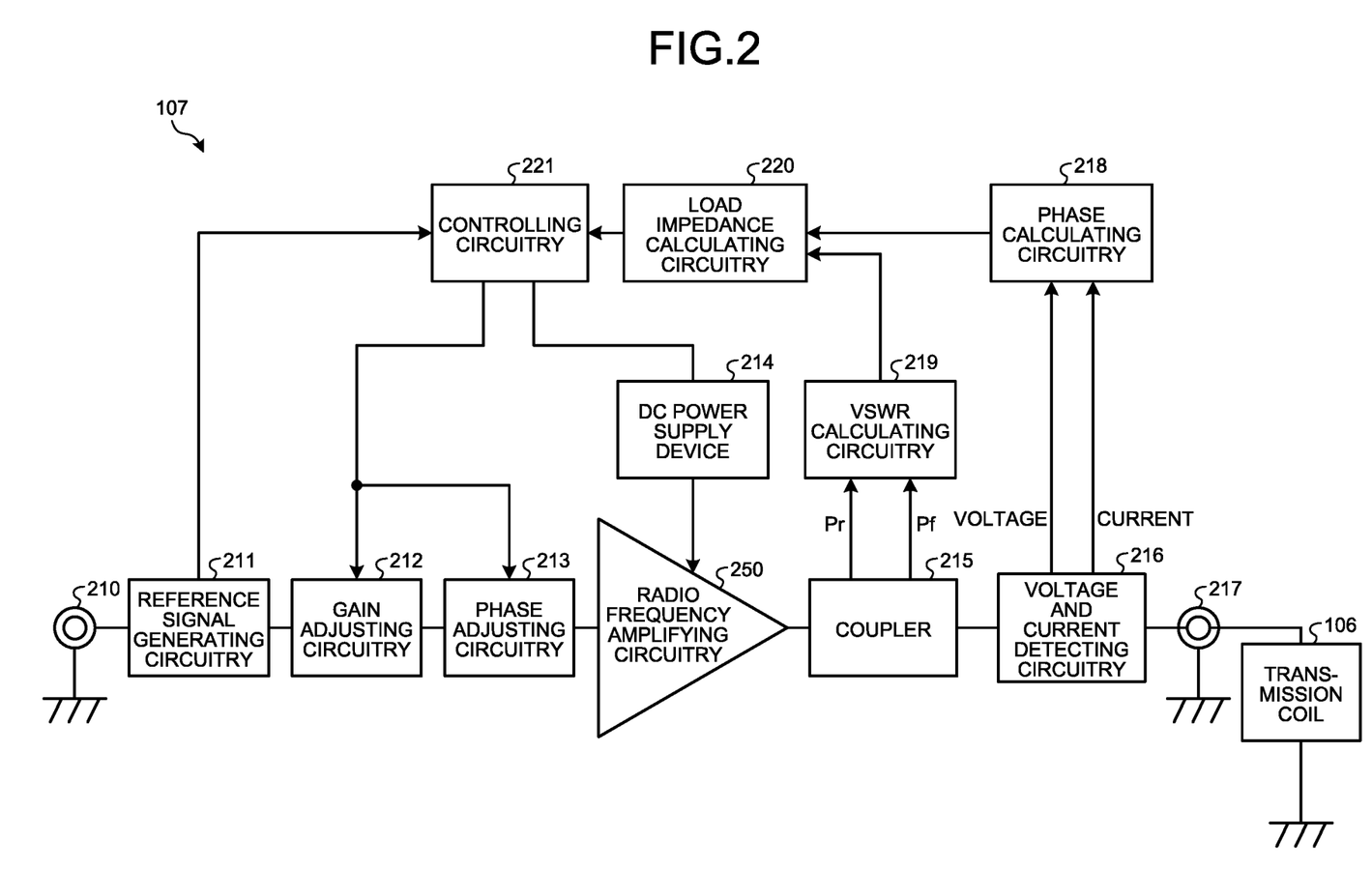
FIG. 2 is a block diagram illustrating an exemplary configuration of transmission circuitry according to the embodiment.

FIG. 2 is a block diagram illustrating an exemplary configuration of the transmission circuitry 107 according to the present embodiment. As illustrated in FIG. 2, the transmission circuitry 107 includes an input terminal 210, reference signal generating circuitry 211, gain adjusting circuitry 212, phase adjusting circuitry 213, a Direct Current (DC) power supply device 214, radio frequency amplifying circuitry 250, a coupler 215, voltage and current detecting circuitry 216, an output terminal 217, phase calculating circuitry 218, Voltage Standing Wave Rate (VSWR) calculating circuitry 219, load impedance calculating circuitry 220, and controlling circuitry 221.

The input terminal 210 is connected to an output terminal of the sequence controlling circuitry 110. The transmission circuitry 107 is configured to obtain the RF input signal from the sequence controlling circuitry 110 via the input terminal 210.

The reference signal generating circuitry 211 is configured to generate a reference signal from the RF input signal input thereto through the input terminal 210. The reference signal generating circuitry 211 is configured to send the generated reference signal to the controlling circuitry 221. For example, the reference signal may be the same signal as the RF input signal or may be a signal obtained as a result of a converting process performed on the RF input signal by the reference signal generating circuitry 211. Specifics of the converting process are not particularly limited.

Under control of the controlling circuitry 221, the gain adjusting circuitry 212 is configured to either attenuate or amplify the RF input signal. In the present embodiment, the relationship between the RF input signal input to the transmission circuitry 107 and the output amplified signal is controlled with a high level of precision, by causing the gain adjusting circuitry 212 to adjust the amplitude of the RF input signal, before causing the radio frequency amplifying circuitry 250 to amplify the RF input signal.

In the present embodiment, a gain denotes an input/output relationship of voltage. More specifically, the gain denotes the ratio between input voltage and output voltage. By either attenuating or amplifying the RF input signal, the gain adjusting circuitry 212 is configured to adjust the voltage relationship between the RF input signal input to the transmission circuitry 107 and the output amplified signal.

The phase adjusting circuitry 213 is configured to adjust the phase of the RF input signal, under the control of the controlling circuitry 221.

Although FIG. 2 illustrates the gain adjusting circuitry 212 and the phase adjusting circuitry 213 as separate pieces of circuitry, this configuration is merely an example. In another example, a single piece of adjusting circuitry having the functions of the gain adjusting circuitry 212 and the phase adjusting circuitry 213 may be provided in the transmission circuitry 107.

The DC power supply device 214 is configured to supply DC power to the radio frequency amplifying circuitry 250. Further, under the control of the controlling circuitry 221, the DC power supply device 214 is configured to adjust direct current voltage (DC voltage) supplied to the radio frequency amplifying circuitry 250. When the DC voltage changes, an operating point of the radio frequency amplifying circuitry 250 changes.

The operating point is a point used as a reference of an operation when the radio frequency amplifying circuitry 250 amplifies the RF input signal.

The radio frequency amplifying circuitry 250 is configured to amplify the RF input signal and to output the amplified signal. In the present embodiment, the radio frequency amplifying circuitry 250 is configured go amplify the RF input signal of which the gain and the phase have been adjusted by the gain adjusting circuitry 212 and the phase adjusting circuitry 213. The radio frequency amplifying circuitry 250 may be referred to as an RF amplifier. The amplified signal output by the radio frequency amplifying circuitry 250 is supplied to the transmission coil 106 via the output terminal 217. The amplified signal output through the output terminal 217 may be referred to as an output signal of the transmission circuitry 107.

The coupler 215 and the voltage and current detecting circuitry 216 are provided between the radio frequency amplifying circuitry 250 and the output terminal 217. The order in which the coupler 215 and the voltage and current detecting circuitry 216 are arranged is not limited to the example illustrated in FIG. 2. For instance, being opposite from the example in FIG. 2, the voltage and current detecting circuitry 216 may be arranged closer to the radio frequency amplifying circuitry 250 than the coupler 215 is.

The coupler 215 is configured to output the amplified signal output from the radio frequency amplifying circuitry 250 to the output terminal 217 side and to output Forward Power (Pf) of the amplified signal to the VSWR calculating circuitry 219. Further, the coupler 215 is configured to output Reflected Power (Pr) from the output terminal 217 side to the VSWR calculating circuitry 219. The coupler 215 may be referred to as a directional coupler.

The voltage and current detecting circuitry 216 is configured to detect the voltage and the current of the amplified signal output from the radio frequency amplifying circuitry 250. The voltage and current detecting circuitry 216 is configured to send the detected voltage and current to the phase calculating circuitry 218.

The output terminal 217 is configured to output the amplified signal output from the radio frequency amplifying circuitry 250 to the transmission coil 106.

The phase calculating circuitry 218 is configured to calculate a phase difference between the voltage and the current detected by the voltage and current detecting circuitry 216. The phase calculating circuitry 218 is configured to send the calculated phase difference between the voltage and the current to the load impedance calculating circuitry 220.

The VSWR calculating circuitry 219 is configured to calculate a VSWR from the forward power and the reflected power obtained from the coupler 215. The VSWR calculating circuitry 219 is configured to send the calculated VSWR to the load impedance calculating circuitry 220.

The load impedance calculating circuitry 220 is configured to calculate a load impedance on the basis of information about the VSWR and the phase on the output side of the radio frequency amplifying circuitry 250. More specifically, the load impedance calculating circuitry 220 is configured to calculate the load impedance from the VSWR calculated by the VSWR calculating circuitry 219 and the phase difference calculated by the phase calculating circuitry 218.

The load impedance calculating circuitry 220 is configured to send the calculated load impedance to the controlling circuitry 221.

The controlling circuitry 221 is configured to adjust the gain and the phase of the RF input signal to be input to the radio frequency amplifying circuitry 250, so that the RF input signal input to the transmission circuitry 107 is amplified with a specified amplification factor and a specified phase, in accordance with the load impedance calculated by the load impedance calculating circuitry 220. In other words, the controlling circuitry 221 is configured to adjust the gain and the phase of the RF input signal to be input to the radio frequency amplifying circuitry 250, so that the transmission circuitry 107 maintains predetermined linearity. For example, the controlling circuitry 221 adjusts the gain and the phase of the RF input signal while taking a decrease in the linearity of the radio frequency amplifying circuitry 250 into account and inputs the adjusted RF input signal to the radio frequency amplifying circuitry 250.

For example, the specified amplification factor is a ratio between the RF input signal input to the radio frequency amplifying circuitry 250 and the amplified signal output from the radio frequency amplifying circuitry 250 in the situation where the load impedance has a specified value (e.g., $50\Omega \pm j0\Omega$). Further, the specified phase is the phase of the amplified signal observed when the RF input signal is input to the radio frequency amplifying circuitry 250 in the situation where the load impedance has the specified value. On the premise that the radio frequency amplifying circuitry 250 does not change the phase, the specified phase is the same as the pre-adjustment phase of the RF input signal input to the transmission circuitry 107. The specified amplification factor and the specified phase are determined by the sequence controlling circuitry 110, for example.

For example, let us assume that the radio frequency amplifying circuitry 250 according to the present embodiment is designed so that the impedances match between the input side and the output side when the load impedance is within the range of 50Ω±j0Ω. However, when the load impedance fluctuates and has a value outside the range of 50Ω±j0Ω, the linearity of the radio frequency amplifying circuitry 250 decreases. The fluctuation of the load impedance occurs as a result of, for example, the patient P entering the imaging taking opening of the MRI apparatus 100. In the present embodiment, the specified value of the load impedance is 50Ω±j0Ω, for example; however, possible embodiments are not limited to this example. It is assumed that, when the load impedance has the specified value, the impedances match between the input and output of the radio frequency amplifying circuitry 250.

Figure 3:
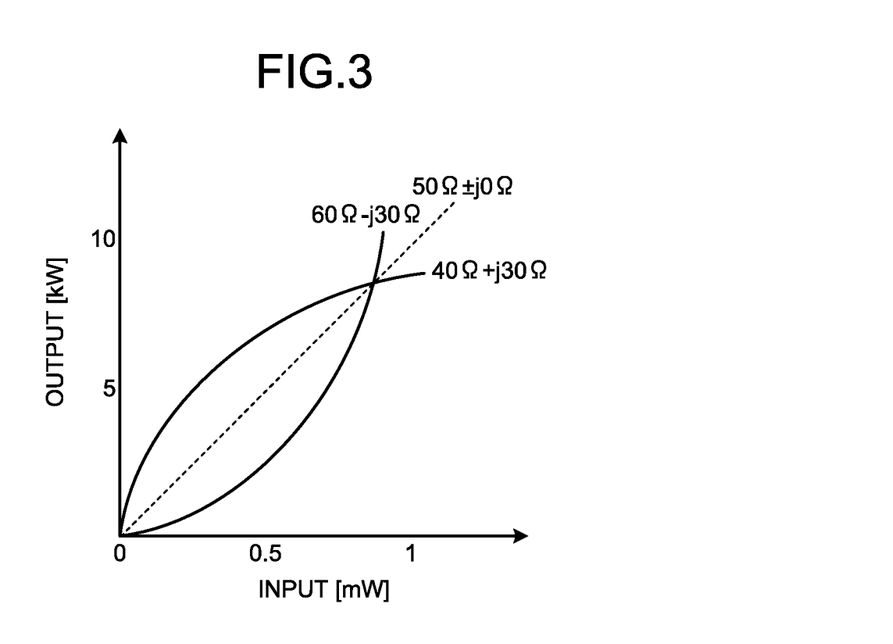
FIG. 3 is a chart illustrating examples of relationships between RF input signals and amplified signals regarding radio frequency amplifying circuitry according to the embodiment.
Figure 4:
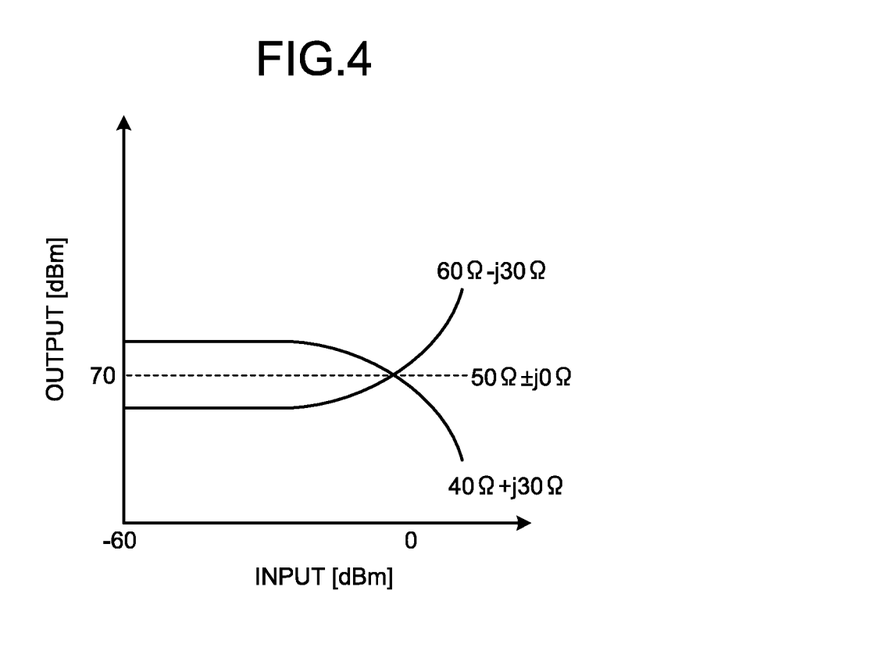
FIG. 4 is a chart illustrating examples of gains of the radio frequency amplifying circuitry according to the embodiment.
Figure 5:
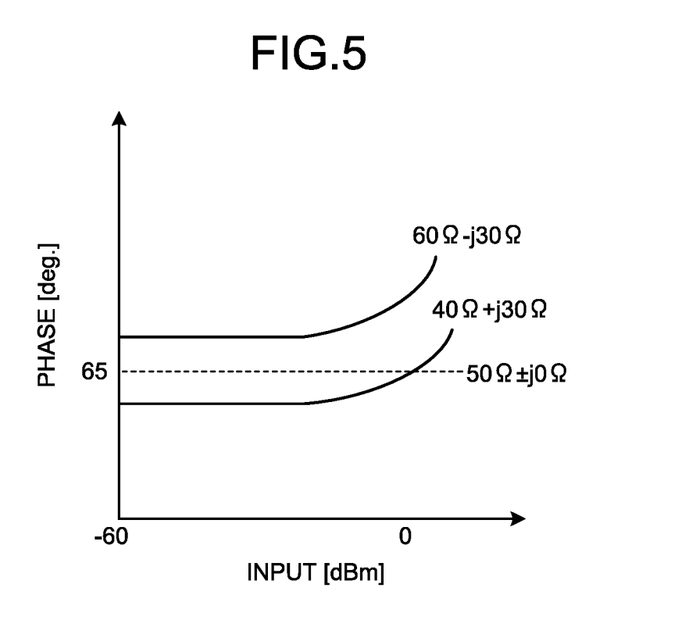
FIG. 5 is a chart illustrating examples of relationships between RF input signals and phases of an amplified signal regarding the radio frequency amplifying circuitry according to the embodiment.

FIGS. 3 to 5 are conceptual drawings illustrating changes in the output of the radio frequency amplifying circuitry 250 caused by fluctuation of the load impedance. In FIGS. 3 to 5, graphs corresponding to the situation where the load impedance is within the range of 50Ω±j0Ω are indicated with broken lines. In contrast, graphs corresponding to the situation where the load impedance is outside the range of 50Ω±j0Ω are indicated with solid lines.

For example, FIG. 3 is a chart illustrating examples of relationships between RF input signals and amplified signals regarding the radio frequency amplifying circuitry 250 according to the embodiment. In the chart in FIG. 3, the horizontal axis expresses the RF input signal, whereas the vertical axes expresses the power (kW) of the amplified signal. As indicated with the broken line in FIG. 3, when the load impedance is within the range of 50Ω±j0Ω, the radio frequency amplifying circuitry 250 outputs an amplified signal 10 million times as large as the RF input signal, regardless of the values of the RF input signal. In other words, when the load impedance is within the range of 50Ω±j0Ω, the radio frequency amplifying circuitry 250 maintains the linearity.

On the contrary, as indicated with the solid lines in FIG. 3, when the load impedance is outside the range of 50Ω±j0Ω, the linearity decreases, and the degree of amplification is smaller or larger than the specified amplification factor, i.e., the amplification factor corresponding to the situation where the load impedance has the specified value (e.g., within the range of 50Ω±j0Ω).

For example, as illustrated in FIG. 3, when the RF input signal input to the radio frequency amplifying circuitry 250 is 0.5 mW while the load impedance is within the range of 50Ω±j0Ω, the amplified signal is 5 kW, which is 10 million times as large as the RF input signal. In contrast, while the load impedance is 60Ω−j30Ω, when an RF input signal of 0.5 mW is input to the radio frequency amplifying circuitry 250, the amplified signal is equal to approximately 2 kW. The amplified signal is approximately 4 million times as large as the input signal, which means that the amplification factor has decreased. In another example, while the load impedance is 40Ω+j30Ω, when an RF input signal of 0.5 mW is input to the radio frequency amplifying circuitry 250, the amplified signal is equal to approximately 7 kW. The amplified signal is approximately 14 million times as large as the RF input signal, which means that the amplification factor has increased.

Further, when the linearity of the radio frequency amplifying circuitry 250 has decreased, because the relationship between the RF input signal and the amplified signal is non-linear, the amplification factor fluctuates in accordance with the RF input signal, even when the load impedance is the same. For example, while the load impedance is 40Ω+j30Ω, when the RF input signal is 0.5 mW as described above, the amplified signal is approximately 14 million times as large as the RF input signal. In contrast, while the load impedance is, again, 40Ω+j30Ω, when the RF input signal is 1 mW, the amplified signal is approximately 8 kW, which is approximately 8 million times as large as the RF input signal.

FIG. 4 is a chart illustrating examples of gains of the radio frequency amplifying circuitry 250 according to the present embodiment. In FIG. 4, the gains of the radio frequency amplifying circuitry 250 are expressed in dBm. As illustrated in FIG. 4, when the load impedance is within the range of 50Ω±j0Ω, the output of the radio frequency amplifying circuitry 250 exhibits a certain value while maintaining linearity. In contrast, when the load impedance is outside the range of 50Ω±j0Ω, the relationship between the input and the output of the radio frequency amplifying circuitry 250 is non-linear.

Further, FIG. 5 is a chart illustrating examples of relationships between RF input signals and phases of the amplified signal regarding the radio frequency amplifying circuitry 250 according to the present embodiment. As illustrated in FIG. 5, when the load impedance is within the range of 50Ω±j0Ω, i.e., has the specified value, the phase of the amplified signal being output by the radio frequency amplifying circuitry 250 maintains the specified phase, regardless of the magnitude of the RF input signal. On the contrary, when the load impedance is outside the range of 50Ω±j0Ω, the phase of the amplified signal fluctuates depending on the magnitude of the RF input signal. For this reason, in some situations, the phase of the amplified signal being output by the radio frequency amplifying circuitry 250 may deviate from the specified phase.

All the values illustrated in FIGS. 3 to 5 are merely examples, and possible characteristics of the radio frequency amplifying circuitry 250 are not limited to those in the examples. For instance, in FIGS. 3 to 5, the radio frequency amplifying circuitry 250 maintains the linearity when the load impedance is within the range of 50Ω±j0Ω; however, possible specified values of the load impedance that enable the impedances to match between the input side and the output side of the radio frequency amplifying circuitry 250 are not limited to the value in this example. Further, all the values illustrated in FIGS. 3 to 5 are merely examples, and possible characteristics of the radio frequency amplifying circuitry 250 are not limited to those in the examples in FIGS. 3 to 5.

More specifically, the controlling circuitry 221 is configured to adjust the gain and the phase of the RF input signal, by controlling the gain adjusting circuitry 212 and the phase adjusting circuitry 213 in accordance with the load impedance calculated by the load impedance calculating circuitry 220.

For example, as illustrated in FIG. 3, while the load impedance has the specified value, the amplified signal is equal to 10 kW when the RF input signal input to the radio frequency amplifying circuitry 250 is equal to 1 mW. In contrast, while the load impedance is 40Ω+j30Ω, the amplified signal is approximately 8 kW when the RF input signal input to the radio frequency amplifying circuitry 250 is equal to 1 mW. In that situation, when the RF input signal input to the transmission circuitry 107 is 1 mW, the controlling circuitry 221 according to the present embodiment adjusts the RF input signal input to the transmission circuitry 107 before the signal is input to the radio frequency amplifying circuitry 250, so that the amplified signal is 10 kW with the specified amplification even when the load impedance is 40Ω+j30Ω.

Further, the controlling circuitry 221 further controls the operating point of the radio frequency amplifying circuitry 250, in accordance with the load impedance calculated by the load impedance calculating circuitry 220. More specifically, the controlling circuitry 221 changes the operating point of the radio frequency amplifying circuitry 250, by controlling the DC power supply device 214 so as to change the DC voltage applied to the radio frequency amplifying circuitry 250.

The operating point is the center of amplitude of the output waveform of the amplified signal. Accordingly, when the operating point is too high or too low, because the upper side or the lower side of the output waveform is clipped, the output waveform may be distorted or it may be impossible, in some situations, to output a waveform having a specified magnitude.

The operating point varies depending on the load impedance and the DC voltage. For example, when the load impedance is larger, because the operating point becomes lower, the lower side of the output waveform of the amplified signal may be clipped. In that situation, the controlling circuitry 221 causes the DC power supply device 214 to increase the DC voltage, so that the operating point is raised to such a position where neither the upper limit nor the lower limit of the amplitude of the output waveform of the amplified signal is clipped.

As a result of the operating point of the radio frequency amplifying circuitry 250 being adjusted to the appropriate value, the radio frequency amplifying circuitry 250 is able to operate efficiently. In addition, as a result of the operating point of the radio frequency amplifying circuitry 250 being adjusted to the appropriate value, it is possible to reduce distortion of the amplified signal.

Further, in the present embodiment, on the basis of the calculated load impedance and adjustment value information, the controlling circuitry 221 is configured to determine the gain and the phase of the RF input signal and an adjustment value for the DC voltage supplied to the radio frequency amplifying circuitry 250, so that the RF input signal input to the transmission circuitry 107 is amplified with the specified amplification factor and the specified phase.

Figure 6:
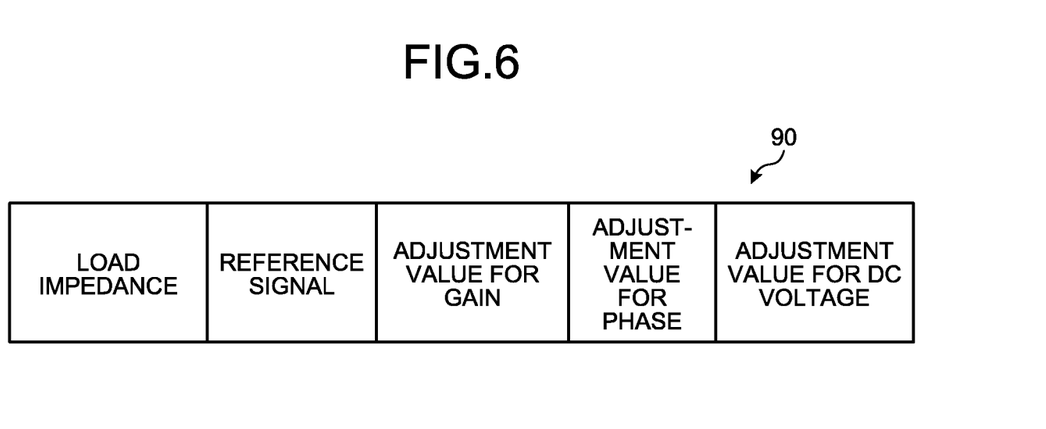
FIG. 6 is a drawing illustrating an exemplary configuration of adjustment value information according to the embodiment.

FIG. 6 is a drawing illustrating an exemplary configuration of adjustment value information 90 according to the present embodiment. In the present embodiment, as illustrated in FIG. 6, the adjustment value information 90 indicates a correspondence relationship among a set made up of a load impedance and a reference signal calculated from the RF input signal, an adjustment value for the gain, an adjustment value for the phase, and an adjustment value for the DC voltage. Although in FIG. 6 the reference signal is used in the adjustment value information 90, the RF input signal may be used.

As explained with reference to FIGS. 3 to 5, when the load impedance has a value other than the specified value, the relationship between the RF input signal of the radio frequency amplifying circuitry 250 and the gain and the phase of the amplified signal fluctuates depending on the RF input signal. For this reason, the adjustment value for the gain, the adjustment value for the phase, and the adjustment value for the DC voltage in the adjustment value information change, depending on not only the load impedance, but also the RF input signal.

Accordingly, the adjustment value information 90 indicates the correspondence relationship among the set made up of a load impedance and an RF input signal, the adjustment value for the gain, the adjustment value for the phase, and the adjustment value for the DC voltage. In the present example, the RF input signal is the RF input signal before the gain and the phase thereof are adjusted.

For example, as illustrated in FIG. 3, while the RF input signal input to the radio frequency amplifying circuitry 250 is 1 mW, when the load impedance is 40Ω+j30Ω, the amplification factor is smaller than that corresponding to the situation where the load impedance has the specified value. In contrast, while the RF input signal input to the radio frequency amplifying circuitry 250 is 0.5 mW, when the load impedance is 40Ω+j30Ω, the amplification factor is larger than that corresponding to the situation where the load impedance has the specified value. The adjustment value for the gain is a value that takes into account non-linearity of the radio frequency amplifying circuitry 250 corresponding to the value of the load impedance. Also, the adjustment value for the phase and the adjustment value for the DC voltage are each a value that takes into account non-linearity of the radio frequency amplifying circuitry 250 corresponding to the value of the load impedance.

The adjustment value information 90 may be stored in storage such as a RAM or a flash memory provided in the controlling circuitry 221. Alternatively, the adjustment value information 90 may be incorporated in the controlling circuitry 221 in advance.

From the adjustment value information 90, the controlling circuitry 221 is configured to obtain the adjustment value for the gain, the adjustment value for the phase, and the adjustment value for the DC voltage that are kept in correspondence with the load impedance calculated by the load impedance calculating circuitry 220 and the reference signal calculated from the RF input signal.

On the basis of the adjustment value for the gain, the adjustment value for the phase, and the adjustment value for the DC voltage obtained from the adjustment value information 90, the controlling circuitry 221 is configured to adjust the gain and the phase of the RF input signal to be input to the radio frequency amplifying circuitry 250 and the DC voltage supplied to the radio frequency amplifying circuitry 250. For example, by controlling the gain adjusting circuitry 212, the controlling circuitry 221 either attenuates or increases the amplitude of the RF input signal by the adjustment value for the gain. Also, by controlling the phase adjusting circuitry 213, the controlling circuitry 221 corrects the phase of the RF input signal by the adjustment value for the phase. In addition, by controlling the DC power supply device 214, the controlling circuitry 221 changes the DC voltage supplied by the DC power supply device 214 to the radio frequency amplifying circuitry 250, by the adjustment value for the DC voltage.

The method used by the controlling circuitry 221 to control the gain adjusting circuitry 212, the phase adjusting circuitry 213, and the DC power supply device 214 is not particularly limited. For example, the controlling circuitry 221 may transmit a control signal informing each of the gain adjusting circuitry 212, the phase adjusting circuitry 213, and the DC power supply device 214 of an adjustment value.

As a result of the control exercised by the controlling circuitry 221, the gain and the phase of the RF input signal are adjusted by the gain adjusting circuitry 212 and the phase adjusting circuitry 213, before the RF input signal is input to the radio frequency amplifying circuitry 250. Because of these adjustments, even when the load impedance has a value other than the specified value, the amplified signal output from the radio frequency amplifying circuitry 250 is close to an amplified signal corresponding to the situation where the load impedance has the specified value. Accordingly, even when the linearity of the radio frequency amplifying circuitry 250 has decreased, the linearity is maintained in the transmission circuitry 107 as a whole. In other words, the amplified signal obtained by amplifying the pre-adjustment RF input signal input to the transmission circuitry 107 by using the specified amplification factor is supplied to the transmission coil 106.

Next, a flow in the RF input signal amplifying process performed in the transmission circuitry 107 according to the present embodiment configured as described above will be explained.

Figure 7:
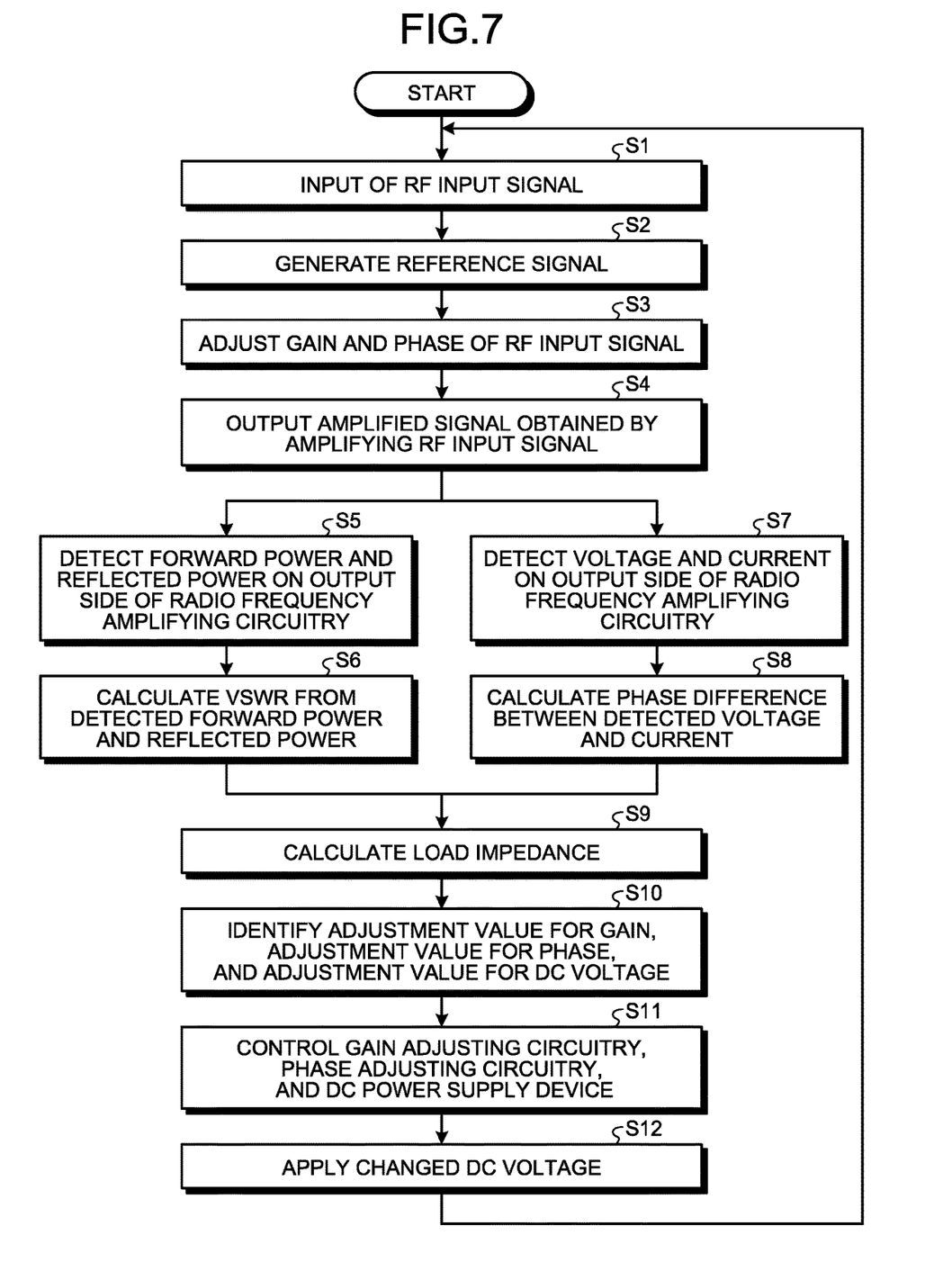
FIG. 7 is a flowchart illustrating an example of a flow in an RF input signal amplifying process performed in the transmission circuitry according to the embodiment.

FIG. 7 is a flowchart illustrating an example of the flow in the RF input signal amplifying process performed in the transmission circuitry 107 according to the present embodiment. At the start of the flowchart, it is assumed that the application of the DC voltage from the DC power supply device 214 to the radio frequency amplifying circuitry 250 has already started.

At first, the sequence controlling circuitry 110 inputs an RF input signal to the input terminal 210 of the transmission circuitry 107 (S1).

From the RF input signal input through the input terminal 210, the reference signal generating circuitry 211 generates a reference signal (S2). The reference signal generating circuitry 211 sends the generated reference signal to the controlling circuitry 221.

After that, the gain adjusting circuitry 212 and the phase adjusting circuitry 213 adjust the gain and the phase of the RF input signal (S3).

Subsequently, the radio frequency amplifying circuitry 250 outputs an amplified signal obtained by amplifying the post-adjustment RF input signal of which the gain and the phase have been adjusted by the gain adjusting circuitry 212 and the phase adjusting circuitry 213 (S4).

At the time when the RF input signal is initially input, because the controlling circuitry 221 has not yet controlled the gain adjusting circuitry 212 and the phase adjusting circuitry 213 on the basis of the output of the radio frequency amplifying circuitry 250, the gain adjusting circuitry 212 and the phase adjusting circuitry 213 may let the input RF input signal pass without any corrections. In that situation, the radio frequency amplifying circuitry 250 outputs an amplified signal obtained by amplifying the RF input signal input through the input terminal 210.

Subsequently, the coupler 215 detects forward power and reflected power on the output side of the radio frequency amplifying circuitry 250 (S5). The coupler 215 sends the detected forward power and reflected power to the VSWR calculating circuitry 219.

After that, the VSWR calculating circuitry 219 calculates a VSWR from the detected forward power and reflected power (S6). The VSWR calculating circuitry 219 sends the calculated VSWR to the load impedance calculating circuitry 220.

Further, the voltage and current detecting circuitry 216 detects the voltage and the current on the output side of the radio frequency amplifying circuitry 250 (S7). The voltage and current detecting circuitry 216 sends the detected voltage and current to the phase calculating circuitry 218.

After that, the phase calculating circuitry 218 calculates a phase difference between the detected voltage and current (S8). The phase calculating circuitry 218 sends the calculated phase difference to the load impedance calculating circuitry 220.

On the basis of the VSWR calculated by the VSWR calculating circuitry 219 and the phase different calculated by the phase calculating circuitry 218, the load impedance calculating circuitry 220 calculates a load impedance (S9). The load impedance calculating circuitry 220 sends the calculated load impedance to the controlling circuitry 221.

From the adjustment value information 90, the controlling circuitry 221 identifies an adjustment value for the gain, an adjustment value for the phase, and an adjustment value for the DC voltage that correspond to the set made up of the load impedance calculated by the load impedance calculating circuitry 220 and the reference signal input by the reference signal generating circuitry 211 (S10).

After that, on the basis of the identified adjustment values, the controlling circuitry 221 controls the gain adjusting circuitry 212, the phase adjusting circuitry 213, and the DC power supply device 214 (S11). For example, the controlling circuitry 221 changes the setting of the gain adjusting circuitry 212 by the identified gain adjustment value. Further, the controlling circuitry 221 changes the setting of the phase adjusting circuitry 213 by the identified phase adjustment value. Also, the controlling circuitry 221 changes the setting of the DC power supply device 214 by the identified DC voltage adjustment value.

Subsequently, the DC power supply device 214 applies the DC voltage that has been changed by the DC voltage adjustment value, to the radio frequency amplifying circuitry 250 (S12).

After that, the process returns to S1 where an RF input signal is input from the sequence controlling circuitry 110 to the input terminal 210 of the transmission circuitry 107. Subsequently, when the process at S2 is performed, the gain adjusting circuitry 212 either attenuates or increases the amplitude of the RF input signal by the gain adjustment value set by the controlling circuitry 221 in the process at S11. Further, the phase adjusting circuitry 213 corrects the phase of the RF input signal by the phase adjustment value set by the controlling circuitry 221 in the process at S11.

The processes in the flowchart are repeatedly performed while the transmission circuitry 107 is in operation.

As explained above, the transmission circuitry 107 according to the present embodiment is configured to adjust the gain and the phase of the RF input signal to be input to the radio frequency amplifying circuitry 250, in accordance with the load impedance calculated on the basis of the information about the VSWR and the phase on the output side of the radio frequency amplifying circuitry 250. With these arrangements, in the transmission circuitry 107 according to the present embodiment, the radio frequency amplifying circuitry 250 receives the input of the RF input signal adjusted while taking into account the decrease in the linearity of the radio frequency amplifying circuitry 250 caused by the fluctuation of the load impedance. Accordingly, even when the load impedance fluctuates, the transmission circuitry 107 is able to output an amplified signal having the specified magnitude and phase. Consequently, the transmission circuitry 107 according to the present embodiment is able to maintain the linearity of the transmission circuitry 107 as a whole, even when the load impedance fluctuates.

As a comparison example, another type of transmission circuitry is known in which, for example, an isolator or a circulator is provided between radio frequency amplifying circuitry and an output terminal, so as to eliminate reflected power from the output terminal side to the radio frequency amplifying circuitry and to thus inhibit fluctuation of the load impedance caused by the reflected power. This configuration would require providing the isolator or the circulator and the like, for the purpose of reducing the occurrence itself of unmatched impedances that may be caused by the fluctuation of the load impedance.

In contrast, as for the transmission circuitry 107 according to the present embodiment, even when the load impedance fluctuates, it is possible, as described above, to maintain the linearity of the transmission circuitry 107 as a whole. It is therefore not necessary to provide an isolator or a circulator and the like between the radio frequency amplifying circuitry and the output terminal.

Further, as another comparison example, another technique is known by which, when load impedance has increased, distortion of the output is reduced by decreasing the gain of radio frequency amplifying circuitry. In contrast, in the transmission circuitry 107 according to the present embodiment, the radio frequency amplifying circuitry 250 receives the input of the RF input signal adjusted while taking into account the decrease in the linearity of the radio frequency amplifying circuitry 250 caused by the fluctuation of the load impedance. It is therefore possible to output from the transmission circuitry 107 an amplified signal having the specified magnitude and phase, while maintaining the output of the radio frequency amplifying circuitry 250.

In addition, the transmission circuitry 107 according to the present embodiment is further configured to control the operating point of the radio frequency amplifying circuitry 250 in accordance with the calculated load impedance. More specifically, the transmission circuitry 107 according to the present embodiment is configured to control the operating point of the radio frequency amplifying circuitry 250 by changing the DC voltage supplied to the radio frequency amplifying circuitry 250. With this arrangement, because the transmission circuitry 107 according to the present embodiment adjusts the operating point in accordance with the load impedance, the radio frequency amplifying circuitry 250 is able to operate efficiently.

Further, on the basis of the adjustment value information 90, the transmission circuitry 107 according to the present embodiment is configured to adjust the gain and the phase of the RF input signal to be input to the radio frequency amplifying circuitry 250 and the DC voltage supplied to the radio frequency amplifying circuitry 250. Further, the adjustment value information 90 indicates the correspondence relationship among the set made up of a load impedance and an RF input signal, the adjustment value for the gain, the adjustment value for the phase, and the adjustment value for the DC voltage. With these arrangements, by using the transmission circuitry 107 according to the present embodiment, when the load impedance has a value other than the specified value while the relationship of the gain and the phase between the RF input signal and the amplified signal of the radio frequency amplifying circuitry 250 is non-linear, it is possible to adjust the gain and the phase of the RF input signal and the DC voltage supplied to the radio frequency amplifying circuitry 250, while taking into account changes in the characteristics of the radio frequency amplifying circuitry 250 corresponding to the load impedance and the RF input signal.

Further, the transmission circuitry 107 according to the present embodiment is configured to adjust the gain of the RF input signal, by either attenuating or amplifying the RF input signal to be input to the radio frequency amplifying circuitry 250. By using the transmission circuitry 107 according to the present embodiment, it is possible to control, with a high level of precision, the magnitude of the amplified signal output from the transmission circuitry 107, by adjusting the amplitude of the RF input signal before the radio frequency amplifying circuitry 250 amplifies the RF input signal.

Further, the MRI apparatus 100 according to the present embodiment includes: the transmission circuitry 107 capable of maintaining the linearity of the relationship between the RF input signal and the amplified signal even when the load impedance fluctuates; and the transmission coil 106 configured to generate the radio frequency magnetic field on the basis of the output signal output from the transmission circuitry 107. Accordingly, even when the load impedance of the transmission circuitry 107 fluctuates, it is possible to generate a radio frequency magnetic field based on the amplified signal having the specified magnitude and phase determined by the computer system 120.

In the present embodiment, the example was explained in which the controlling circuitry 221 adjusts the three elements, namely, the gain and the phase of the RF input signal to be input to the radio frequency amplifying circuitry 250 and the DC voltage supplied to the radio frequency amplifying circuitry 250; however, the controlling circuitry 221 may be configured to adjust only the gain and the phase of the RF input signal.

Further, in the present embodiment, the example was explained in which the gain adjusting circuitry 212, the phase calculating circuitry 218, and the radio frequency amplifying circuitry 250 are provided as separate pieces of circuitry in the transmission circuitry 107; however, possible configurations of the transmission circuitry 107 are not limited to this example. For instance, the radio frequency amplifying circuitry 250 may include the functions of the gain adjusting circuitry 212 and the phase calculating circuitry 218.

Further, in the present embodiment, the example was explained in which the adjustment value for the gain, the adjustment value for the phase, and the adjustment value for the DC voltage are saved in advance as the adjustment value information 90; however, the adjustment values may be calculated by the controlling circuitry 221. For example, the controlling circuitry 221 may be configured to calculate the adjustment value for the gain, the adjustment value for the phase, and the adjustment value for the DC voltage from the load impedance and the reference signal by using a calculation formula, an algorithm, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency amplifying device comprising:
   load impedance calculating circuitry configured to calculate a load impedance on a basis of information about a voltage standing wave rate and a phase on an output side of radio frequency amplifying circuitry; and
   controlling circuitry configured to adjust a gain and a phase of a signal to be input to the radio frequency amplifying circuitry, in accordance with the load impedance calculated by the load impedance calculating circuitry.

2. The radio frequency amplifying device according to claim 1, wherein the controlling circuitry further controls an operating point of the radio frequency amplifying circuitry, in accordance with the load impedance calculated by the load impedance calculating circuitry.

3. The radio frequency amplifying device according to claim 2, wherein the controlling circuitry controls the operating point of the radio frequency amplifying circuitry, by changing direct current voltage supplied to the radio frequency amplifying circuitry.

4. The radio frequency amplifying device according to claim 3, wherein the controlling circuitry adjusts the gain and the phase of the signal to be input to the radio frequency amplifying circuitry and the direct current voltage supplied to the radio frequency amplifying circuitry, on a basis of adjustment value information indicating a correspondence relationship among a set made up of the load impedance and the signal, an adjustment value for the gain, an adjustment value for the phase, and an adjustment value for the direct current voltage.

5. The radio frequency amplifying device according to claim 1, wherein the controlling circuitry adjusts the gain of the signal by either attenuating or amplifying the signal to be input to the radio frequency amplifying circuitry.

6. A magnetic resonance imaging apparatus comprising a radio frequency amplifying device and a Radio Frequency (RF) coil, wherein
   the radio frequency amplifying device includes:
      load impedance calculating circuitry configured to calculate a load impedance on a basis of information about a voltage standing wave rate and a phase on an output side of radio frequency amplifying circuitry; and
      controlling circuitry configured to adjust a gain and a phase of a signal to be input to the radio frequency amplifying circuitry, in accordance with the load impedance calculated by the load impedance calculating circuitry, and
   the RF coil generates a radio frequency magnetic field on a basis of an output signal output from the radio frequency amplifying device.

7. The magnetic resonance imaging apparatus according to claim 6, wherein the controlling circuitry further controls an operating point of the radio frequency amplifying circuitry, in accordance with the load impedance calculated by the load impedance calculating circuitry.

8. The magnetic resonance imaging apparatus according to claim 7, wherein the controlling circuitry controls the operating point of the radio frequency amplifying circuitry, by changing direct current voltage supplied to the radio frequency amplifying circuitry.

9. The magnetic resonance imaging apparatus according to claim 8, wherein the controlling circuitry adjusts the gain and the phase of the signal to be input to the radio frequency amplifying circuitry and the direct current voltage supplied to the radio frequency amplifying circuitry, on a basis of adjustment value information indicating a correspondence relationship among a set made up of the load impedance and the signal, an adjustment value for the gain, an adjustment value for the phase, and an adjustment value for the direct current voltage.

10. The magnetic resonance imaging apparatus according to claim 6, wherein the controlling circuitry adjusts the gain of the signal, by either attenuating or amplifying the signal to be input to the radio frequency amplifying circuitry.

* * * * *